United States Patent
Bae

(10) Patent No.: US 11,630,766 B2
(45) Date of Patent: Apr. 18, 2023

(54) MEMORY SYSTEM AND OPERATING METHOD THEREOF

(71) Applicant: SAMSUNG ELECTRONICS CO., LTD., Suwon-si (KR)

(72) Inventor: Duck-Ho Bae, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/144,713

(22) Filed: Jan. 8, 2021

(65) Prior Publication Data

US 2021/0133096 A1 May 6, 2021

Related U.S. Application Data

(63) Continuation of application No. 16/199,304, filed on Nov. 26, 2018, now Pat. No. 10,909,031.

(30) Foreign Application Priority Data

Nov. 29, 2017 (KR) .................. 10-2017-0161842

(51) Int. Cl.
- *G06F 12/02* (2006.01)
- *G06F 12/1009* (2016.01)
- *G06F 3/06* (2006.01)
- *G11C 16/10* (2006.01)

(52) U.S. Cl.
CPC .......... *G06F 12/0246* (2013.01); *G06F 3/061* (2013.01); *G06F 3/065* (2013.01);
(Continued)

(58) Field of Classification Search
CPC ............ G06F 12/0246; G06F 12/1009; G06F 2212/7201; G06F 2212/7207;
(Continued)

(56) References Cited

U.S. PATENT DOCUMENTS 7,694,093 B2 * 4/2010 Shaw .................. G06F 11/1666
711/159
7,873,799 B2 1/2011 Bonwick et al.
(Continued)

FOREIGN PATENT DOCUMENTS

| JP | 2021043246 A | 3/2012 |
|---|---|---|
| KR | 101329937 | 11/2013 |
| KR | 1020160080907 A | 7/2016 |

*Primary Examiner* — Idriss N Alrobaye
*Assistant Examiner* — Richard B Franklin
(74) *Attorney, Agent, or Firm* — Volentine, Whitt & Francos, PLLC

(57) ABSTRACT

A memory system includes a plurality of memory chips, including a first memory chip and a second memory chip, and a controller. The controller includes a first central processing unit (CPU) to process a request received from a host, and a plurality of second CPUs to respectively control operations of the plurality of memory chips through a plurality of channels. An importance table is stored in the controller and includes information about a data programming method for data stored in the memory system, the information about the data programming method corresponding to importance information of the data. The second CPUs are configured to program at least some of the data in both the first memory chip and the second memory chip, based on the importance table, so that at least some of the data is stored in both the first memory chip and the second memory chip as same data.

17 Claims, 15 Drawing Sheets

(52) U.S. Cl.
CPC .......... *G06F 3/0608* (2013.01); *G06F 3/0659* (2013.01); *G06F 3/0679* (2013.01); *G06F 3/0688* (2013.01); *G06F 12/1009* (2013.01); *G11C 16/10* (2013.01); *G06F 2212/7201* (2013.01)

(58) Field of Classification Search
CPC .......... G06F 2212/7208; G06F 3/0608; G06F 3/061; G06F 3/065; G06F 3/0659; G06F 3/0679; G06F 3/0688; G11C 16/10
See application file for complete search history.

(56) References Cited

U.S. PATENT DOCUMENTS

| | | | |
|---|---|---|---|
| 8,144,512 B2 | 3/2012 | Huang et al. | |
| 8,473,760 B2 | 6/2013 | Takeyama et al. | |
| 8,832,357 B2 | 9/2014 | Yao et al. | |
| 8,917,556 B2 | 12/2014 | Kwak | |
| 9,075,957 B2 | 7/2015 | Sela et al. | |
| 10,515,671 B2 * | 12/2019 | Roberts | G11C 7/00 |
| 10,528,439 B2 | 1/2020 | Ahn | |
| 2006/0198202 A1 * | 9/2006 | Erez | G11C 11/005 |
| | | | 365/185.29 |
| 2011/0246821 A1 * | 10/2011 | Eleftheriou | G06F 11/2056 |
| | | | 711/E12.008 |
| 2012/0047340 A1 | 2/2012 | Inaba | |
| 2016/0179403 A1 | 6/2016 | Kurotsuchi et al. | |
| 2016/0328155 A1 | 11/2016 | Um | |
| 2016/0334999 A1 * | 11/2016 | Um | G06F 3/0653 |
| 2017/0010838 A1 | 1/2017 | Hong et al. | |
| 2017/0090778 A1 | 3/2017 | Ishiguro | |

* cited by examiner

| LPN | PPN1 | # of Memory Chips |
|---|---|---|
| PAGE_ADD_L1 | PAGE_ADD_P1 | 2 |
| PAGE_ADD_L2 | PAGE_ADD_P2 | 1 |
| PAGE_ADD_L3 | PAGE_ADD_P3 | 1 |
| ⋮ | ⋮ | ⋮ |
| PAGE_ADD_Lb | PAGE_ADD_Pb | 3 |

FIG. 10A

| LPN | PPN1 |
|---|---|
| PAGE_ADD_L1 | PAGE_ADD_P1 |
| PAGE_ADD_L2 | PAGE_ADD_P2 |
| PAGE_ADD_L3 | PAGE_ADD_P3 |
| ⋮ | ⋮ |
| PAGE_ADD_Lb | PAGE_ADD_Pb |

| n-copy LPN | PPN1 | # of Memory Chips |
|---|---|---|
| PAGE_ADD_L1 | PAGE_ADD_P1 | 2 |
| PAGE_ADD_Lb | PAGE_ADD_Pb | 3 |

140_2

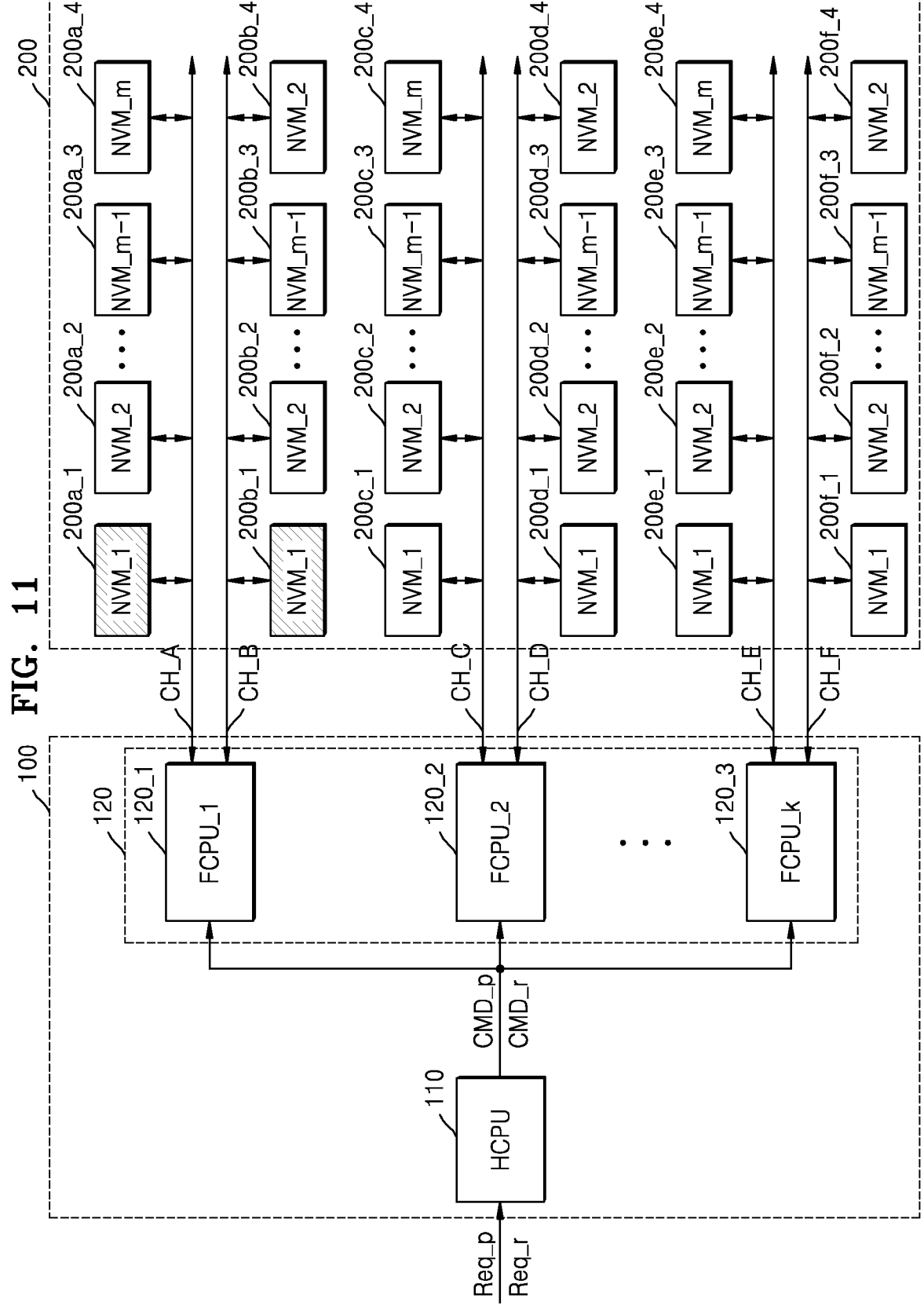

| LPN | PPN1 | PPN2 | PPN3 |
|---|---|---|---|
| PAGE_ADD_L1 | PAGE_ADD_P1_1 | PAGE_ADD_P1_2 | |
| PAGE_ADD_L2 | PAGE_ADD_P2 | | |
| PAGE_ADD_L3 | PAGE_ADD_P3 | | |
| ⋮ | ⋮ | ⋮ | ⋮ |
| PAGE_ADD_Lb | PAGE_ADD_Pb1_1 | PAGE_ADD_Pb_2 | PAGE_ADD_Pb_3 |

FIG. 18A

| DATA_I | # of Memory Chips 131a |
|---|---|
| 0 | 1 |
| 1 | 2 |
| 2 | 3 |
| 3 | 4 |

FIG. 18B

| DATA_I | # of Memory Chips 131b |
|---|---|
| 0 | 1 |
| 1 | 1 |
| 2 | 2 |
| 3 | 2 |

FIG. 19

| DATA_I | Program Type 131c |
|---|---|
| 0 | N |
| 1 | A |
| 2 | B |
| 3 | C |

MEMORY SYSTEM AND OPERATING METHOD THEREOF

CROSS-REFERENCE TO RELATED APPLICATION

This is a Continuation of U.S. application Ser. No. 16/199,304, filed Nov. 26, 2018, now U.S. Pat. No. 10,909,031 issued on Feb. 2, 2021, and a claim of priority is made to Korean Patent Application No. 10-2017-0161842, filed on Nov. 29, 2017, in the Korean Intellectual Property Office, the disclosures of which are incorporated herein in their entirety by reference.

BACKGROUND

The inventive concept relates to a memory system, and more particularly, to a memory system capable of copying and storing the same data in a plurality of memory chips, and an operating method of the memory system.

Memory devices are classified into volatile memory devices and non-volatile memory devices. The volatile memory devices include, for example, dynamic random access memory (DRAM) and static random access memory (SRAM). The non-volatile memory devices include, for example, flash memory, electrically erasable programmable read-only memory (EEPROM), and resistive memory.

Among semiconductor memory devices, non-volatile memory devices, e.g., flash memory devices, are designed to have a multi-plane structure in order to increase a storage capacity thereof. A multi-plane non-volatile memory device includes a plurality of planes, each plane including a plurality of memory blocks.

A host may transmit program, read, and erase requests to a memory system. The memory system performs program, read, and erase operations in response to the program, read, and erase requests received from the host, and times taken to perform the program, read, and erase operations by the memory system differ from each other.

SUMMARY

The inventive concept provides a memory system capable of increasing a data read operation speed by copying and programming the same data in a plurality of memory chips and reading the data from one of the plurality of memory chips, and an operating method of the memory system.

According to an aspect of the inventive concept, there is provided a memory system including a plurality of memory chips including a first memory chip and a second memory chip, and a controller accessing the plurality of memory chips. The controller includes a first central processing unit (CPU) configured to process a request received from a host, and a plurality of second CPUs configured to respectively control operations of the plurality of memory chips through a plurality of channels. An importance table is stored in the controller and includes information about a data programming method for data stored in the memory system, the information about the data programming method corresponding to importance information of data. The second CPUs are configured to program at least some of the data in the first memory chip and the second memory chip based on the importance table, so that the at least some of the data is stored in both the first memory chip and in the second memory chip as same data.

According to another aspect of the inventive concept, there is provided an operating method of a memory system including a first memory chip and a second memory chip. The operating method includes: programming first data in both the first memory chip and the second memory chip in response to a program request for the first data so that the first data is stored in both the first memory chip and the second memory chip as same data; determining, in response to a read request for the first data, whether the first memory chip and the second memory chip are performing an operation for data different from the first data, and reading the first data from one of the first and second memory chips, upon determining that another one of the first and second memory chips is performing an operation for data different from the first data.

According to another aspect of the inventive concept, there is provided an operating method of a memory system including a plurality of memory chips. The operating method includes: programming first data in a plurality of first memory chips among the plurality of memory chips, based on first importance of the first data, so that first data is stored in all of the plurality of first memory chips as same data; programming second data in only a single second memory chip among the plurality of memory chips, based on second importance of the second data, storing, in a first mapping table, a physical address corresponding to at least one of the plurality of first memory chips having the first data stored therein, and storing, in a second mapping table, a physical address corresponding to the single second memory chip having the second data stored therein.

According to yet another aspect of the invention, a memory system, comprises: a plurality of memory chips; and a controller configured to control operations of the plurality of memory chips. The controller includes an importance table having a plurality of entries including at least a first entry and a second entry. The first entry includes first importance information and first programming information which indicates a first number of the plurality of memory chips, and the second entry includes second importance information and second programming information which indicates a second number of the plurality of memory chips. The controller is configured to store first data having a first importance in the first number of the plurality of memory chips according to the first programming information, and is further configured to store second data having a second importance in the second number of the plurality of memory chips according to the second programming information so that the second data is stored in the each of the second number of the plurality of memory chips as same data.

BRIEF DESCRIPTION OF THE DRAWINGS

Embodiments of the inventive concept will be more clearly understood from the following detailed description taken in conjunction with the accompanying drawings.

FIGS. 10A and 10B show a first mapping table and a second mapping table including mapping information between logical addresses and physical addresses of pages to store data therein, in an example embodiment of a memory system.

FIG. 11 is a block diagram of an example embodiment of a memory system.

FIGS. 18A, 18B, and 19 show importance tables stored in a local memory of an example embodiment of a memory system.

DETAILED DESCRIPTION OF THE EMBODIMENTS

Figure 1:
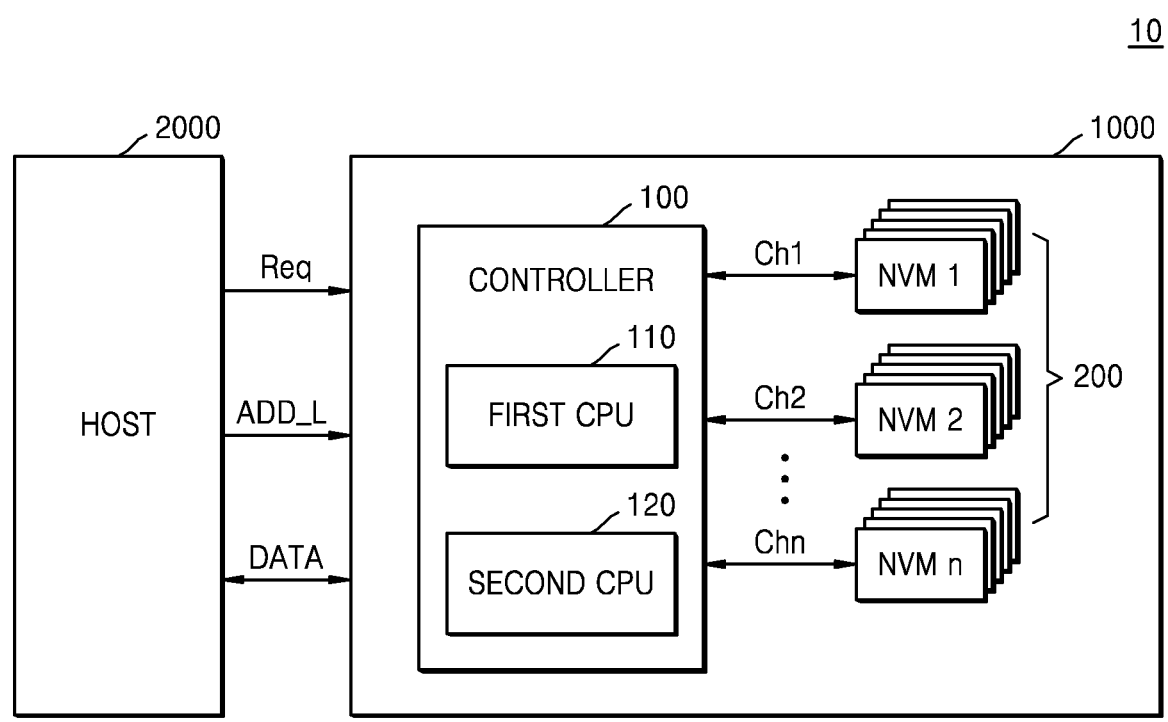
FIG. 1 is a block diagram of an example embodiment of a system including a memory system.

FIG. 1 is a block diagram of a system 10 including a memory system 1000 according to an example embodiment of the inventive concept.

Referring to FIG. 1, system 10 may include a host 2000 and memory system 1000. Memory system 1000 may be a solid state drive (SSD). However, embodiments are not limited thereto and memory system 1000 may be implemented as an embedded multimedia card (eMMC), a universal flash storage (UFS), a redundant array of independent disks (RAID), or the like.

Host 2000 may communicate with memory system 1000 and may include a variety of devices. For example, host 2000 may include a portable electronic device such as a portable media player (PMP), a personal digital assistant (PDA), or a smartphone, an electronic device such as a computer or a high-definition television (HDTV), or application processors installed in the electronic device. Memory system 1000 may perform a memory operation of programming or reading data DATA in or from a location corresponding to a logical address ADD_L in response to a request Req, e.g., a data access request, received from host 2000.

Memory system 1000 may include a controller 100 and one or more non-volatile memory chips 200. Controller 100 may access non-volatile memory chips 200 through one or more channels. For example, memory system 1000 may include n channels Ch1 to Chn, and controller 100 may access non-volatile memory chips 200 through the n channels Ch1 to Chn. For example, controller 100 may access non-volatile memory chips 200 corresponding to different channels in parallel.

Non-volatile memory chips 200 may include flash memory. However, the flash memory is merely an example, and embodiments are not limited thereto. For example, non-volatile memory chips 200 may include non-volatile memory such as resistive random access memory (ReRAM), magnetoresistive random memory (MRAM), or phase-change random access memory (PRAM).

Controller 100 may include one or more central processing units (CPUs) for controlling a memory operation based on the request Req of host 2000. In an embodiment, controller 100 may include one or more first CPUs 110 for performing an operation related to interfacing with host 2000, and one or more seconds CPU 120 for performing an operation related to memory interfacing. First CPUs 110 may be capable of processing requests received from host 2000, in parallel. Second CPUs 120 may be capable of processing accesses to non-volatile memory chips 200, in parallel.

First and second CPUs 110 and 120 may be included in memory system 1000 in various manners. For example, controller 100 may include one first CPU 110 and a plurality of second CPUs 120. Alternatively, controller 100 may include a plurality of first CPUs 110 and a plurality of second CPUs 120. First and second CPUs 110 and 120 may have the same operation speed in an embodiment, or have different operation speeds in another embodiment.

When non-volatile memory chips 200 include flash memory, controller 100 may include a flash translation layer (FTL). The FTL may include system software (or firmware) for managing, for example, program, read, and erase operations of the flash memory, and may be loaded in an internal operating memory of controller 100 and be driven by second CPU 120.

First CPU 110 may generate an internal command by processing a data access request provided from host 2000, and transmit the same to second CPU 120. In a flash memory system, second CPU 120 may perform an address conversion operation or an operation of controlling data exchange with non-volatile memory chips 200, by driving the FTL. First CPU 110 may be called a host CPU (HCPU) because first CPU 110 performs the operation related to interfacing with host 2000, and second CPU 120 may be called a FTL CPU (FCPU) because second CPU 120 performs the operation for driving the FTL.

Memory system 1000 according to an example embodiment may program the same data in a plurality of different memory chips included in non-volatile memory chips 200. In this case, in an embodiment, memory system 1000 may program the same data in a plurality of different memory chips included in non-volatile memory chips 200 based on importance information of data included in a program request Req transmitted from host 2000. In an embodiment, when a read operation is performed based on a command transmitted from host 2000, memory system 1000 may read data selectively from one of the plurality of memory chips where it is stored, for example depending on the current availabilities of the different memory chips. Therefore, a time taken to read the data may be reduced.

Figure 2:
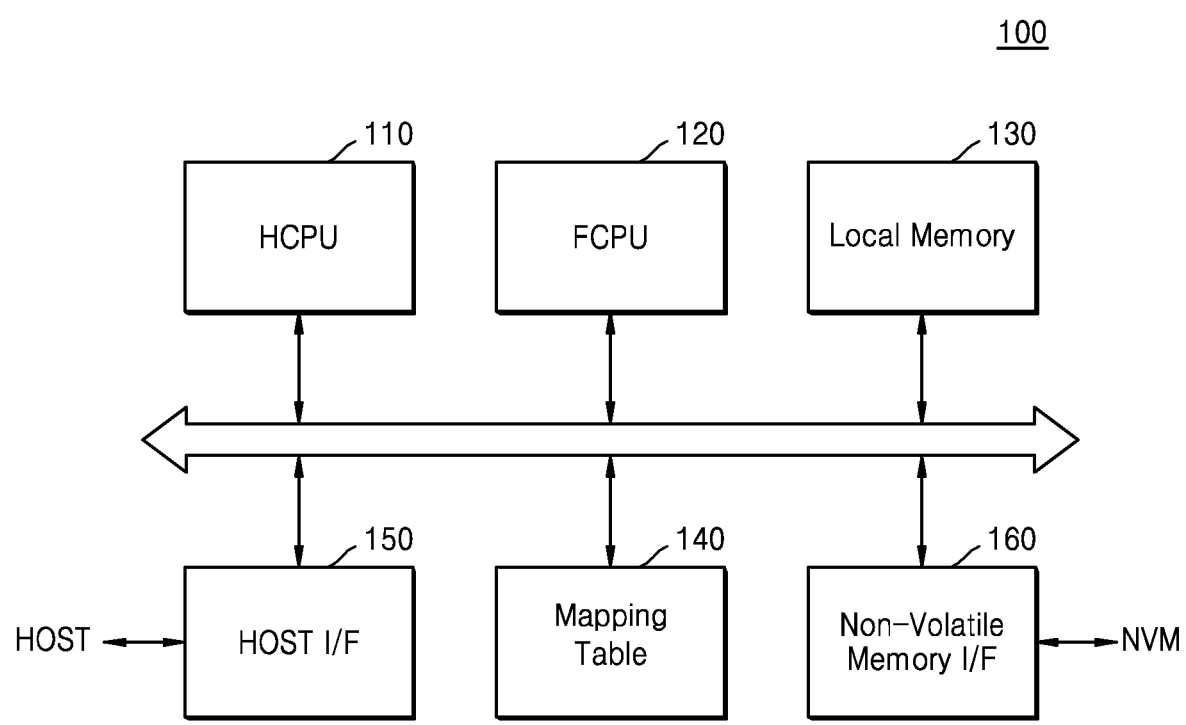
FIG. 2 is a block diagram of an example embodiment of a controller of FIG. 1.

FIG. 2 is a block diagram of an example embodiment of controller 100 of FIG. 1.

Referring to FIGS. 1 and 2, controller 100 may include a HCPU 110, a FCPU 120, a local memory 130, a mapping table 140, a host interface 150, and a memory interface 160. For example, one HCPU 110 and one FCPU 120 are included in controller 100. However, as described above, various numbers of HCPUs and FCPUs may be included in controller 100. In an embodiment, controller 100 may include a plurality of FCPUs 120. HCPU 110 and FCPU 120 may be implemented as one physical element and be functionally divided in the device.

FCPU 120 may perform an address conversion operation for converting a logical address into a physical address, by using the FTL. The FTL may have mapping information between logical addresses on a virtual block device (e.g., host 2000) and physical addresses on non-volatile memory chips, in mapping table 140. When a program request or a read request for a predetermined logical address is received, the FTL may convert the logical address into a physical address by using the mapping information. Mapping table 140 may be updated whenever data DATA received from host 2000 is stored in an internal RAM of controller 100. Although mapping table 140 is illustrated as a separate element, according to an embodiment, mapping table 140 may be included in the RAM or FCPU 120.

Host interface 150 may interface data exchange between host 2000 and controller 100 based on a protocol of host 2000 connected to memory system 1000.

Host interface 150 provides a physical connection between host 2000 and non-volatile memory system 1000. For example, host interface 150 may support various interface standards or protocols such as advanced technology attachment (ATA), serial ATA (SATA), external SATA (e-SATA), small computer small interface (SCSI), serial attached SCSI (SAS), peripheral component interconnection (PCI), PCI express (PCI-E), IEEE 1394, universal serial bus (USB), secure digital (SD) card, multimedia card (MMC), embedded multimedia card (eMMC), and compact flash (CF) card interface standards and protocols.

Memory interface 160 provides a physical connection between controller 100 and non-volatile memory chips 200. For example, a command, an address, and data may be exchanged between controller 100 and non-volatile memory chips 200 through memory interface 160.

Local memory 130 may include random access memory (RAM) used for buffer memory, cache memory, or operating memory. For example, controller 100 may store data DATA received from host 2000, in the RAM, and program the data DATA stored in the RAM, in non-volatile memory chips 200. Controller 100 may store data DATA read from non-volatile memory chips 200, in the RAM, and output the data DATA stored in the RAM, to host 2000.

Controller 100 may store data or code required to manage non-volatile memory chips 200, in the RAM. For example, controller 100 may read data or code required to manage non-volatile memory chips 200, from non-volatile memory chips 200, and load the data or code in the RAM to drive the data or code. The RAM may include at least one of various random access memories such as dynamic RAM (DRAM), static RAM (SRAM), synchronous DRAM (SDRAM), phase-change RAM (PRAM), magnetic RAM (MRAM), resistive RAM (RRAM), and ferroelectric RAM (FeRAM).

Figure 3:
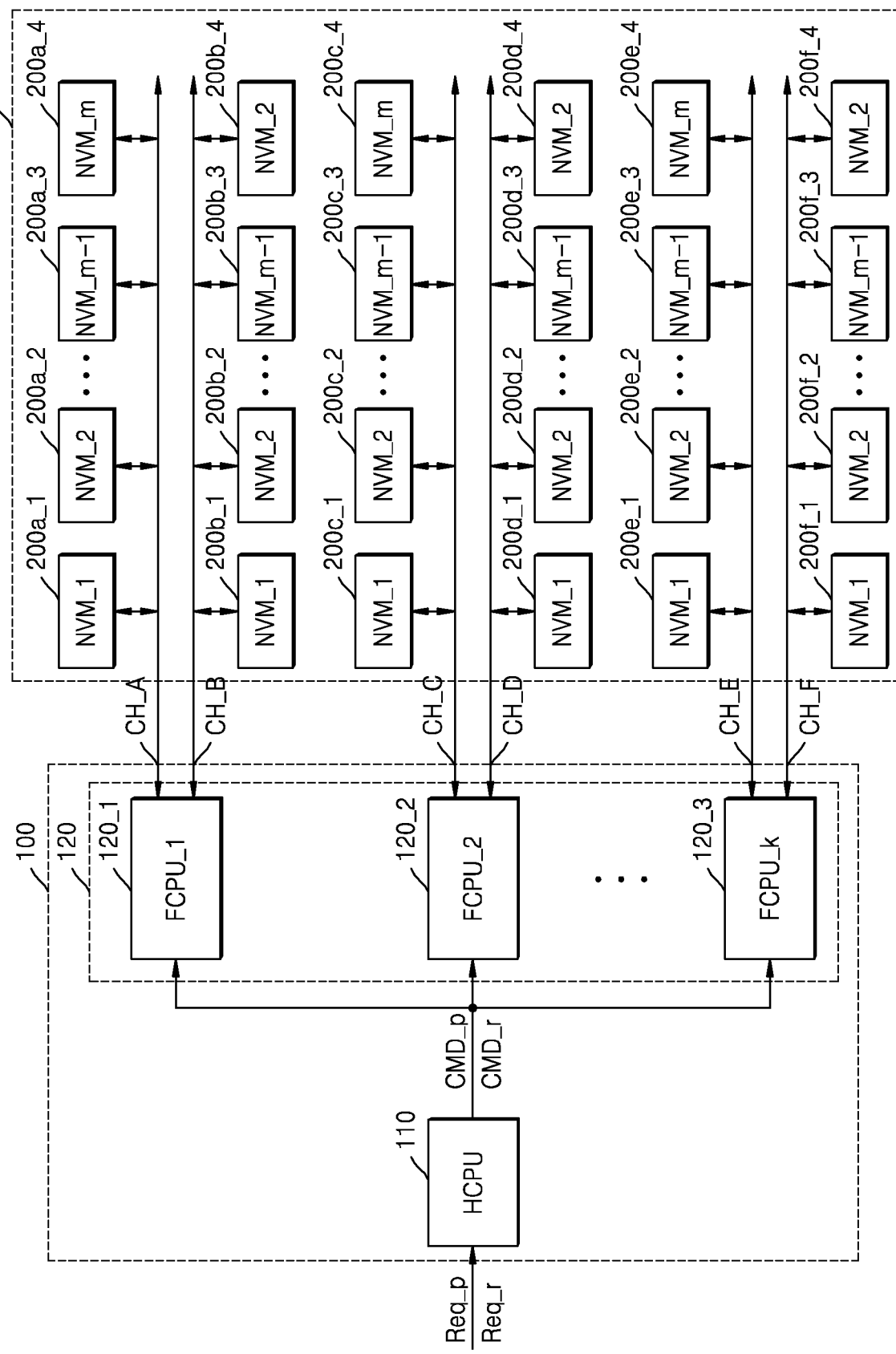
FIG. 3 is a block diagram of an example embodiment of a memory system.
Figure 4:
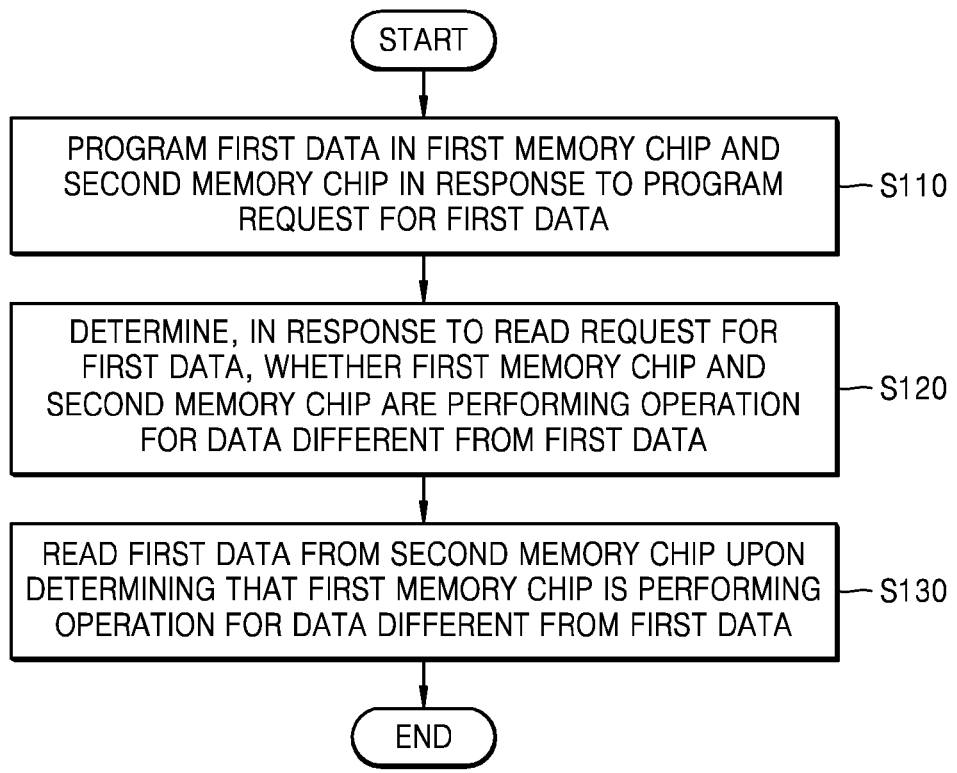
FIG. 4 is a flowchart of an example embodiment of an operating method of a memory system.

FIG. 3 is a block diagram of an example embodiment of a memory system. FIG. 4 is a flowchart of an example embodiment of an operating method of the memory system.

Referring to FIG. 3, controller 100 may include HCPU 110 and FCPU 120. FCPU 120 may include first to k-th FCPUs 120_1 to 120_3. Each of the first to k-th FCPUs 120_1 to 120_3 may be connected to non-volatile memory chips through first and second channels CH_A and CH_B, CH_C and CH_D, or CH_E and CH_F. For example, first FCPU 120_1 may be connected to non-volatile memory chips through the first and second channels CH_A and CH_B.

Each of the first and second channels CH_A and CH_B, CH_C and CH_D, and CH_E and CH_F may be electrically connected to m non-volatile memory chips $200a\_1$ to $200a\_4$, $200b\_1$ to $200b\_4$, $200c\_1$ to $200c\_4$, $200d\_1$ to $200d\_4$, $200e\_1$ to $200e\_4$, or $200f\_1$ to $200f\_4$. In this case, k and m may be natural numbers equal to or greater than 4. Although two channels are connected to each of first to k-th FCPUs 120_1 to 120_3 in FIG. 3, embodiments are not limited thereto and three or more channels may be connected to each of first to k-th FCPUs 120_1 to 120_3.

Each of the first and second channels CH_A and CH_B, CH_C and CH_D, and CH_E and CH_F may refer to an independent bus capable of transmitting and receiving commands, physical addresses, and data to and from non-volatile memory chips $200a\_1$ to $200a\_4$, $200b\_1$ to $200b\_4$, $200c\_1$ to $200c\_4$, $200d\_1$ to $200d\_4$, $200e\_1$ to $200e\_4$, or $200f\_1$ to $200f\_4$ corresponding thereto. Therefore, non-volatile memory chips $200a\_1$ to $200a\_4$, $200b\_1$ to $200b\_4$, $200c\_1$ to $200c\_4$, $200d\_1$ to $200d\_4$, $200e\_1$ to $200e\_4$, and $200f\_1$ to $200f\_4$ connected to different channels may operate independently of one another.

Referring to FIGS. 3 and 4, controller 100 may program first data in both of a first memory chip and a second memory chip in response to a single program request Req_p for the first data (S110). That is, the same data or identical data (e.g., the same first data or identical first data) may be stored in both the first memory chip and the second memory chip. Controller 100 may receive the program request Req_p, the first data, and a first logical address from a host. HCPU 110 may generate an internal program command CMD_p by processing the program request Req_p received from the host. Based on the internal program command CMD_p received from HCPU 110, FCPU 120 may program the first data in each of two or more different memory chips, e.g., the first and second memory chips. That is, FCPU 120 may program the same data or identical data (e.g., the same first data or identical first data) in both the first memory chip and the second memory chip.

FCPU 120 may determine whether to program the first data in one memory chip or in a plurality of memory chips, based on importance information of the first data. Upon determining to program the first data in a plurality of memory chips, FCPU 120 may determine the number of memory chips to program the first data therein, and a method of programming the first data.

In an embodiment, the importance information of the first data may be included in the program request Req_p for the first data, which is received from the host, or may be received from the host as a separate command. In an embodiment, the importance information of the first data may be generated in the memory system based on the number of times that a read request Req_r for the first data is received. An operation of programming data based on the importance of the data to be programmed will be described below in relation to FIG. 15.

In an embodiment, HCPU 110 may transmit the internal program command CMD_p to one of first to k-th FCPUs 120_1 to 120_3, e.g., first FCPU 120_1. First FCPU 120_1 may receive the internal program command CMD_p from HCPU 110, and convert the first logical address into a first physical address and a second physical address corresponding thereto. First FCPU 120_1 may program the first data in a first memory chip corresponding to the first physical address and a second memory chip corresponding to the second physical address. In this case, the first and second memory chips may be memory chips connected to the same channel (e.g., 200a_1 and 200a_2 connected to CH_A), or memory chips connected to different channels (e.g., 200a_1 and 200b_1 connected to CH_A and CH_B). The case in which the first and second memory chips are connected to the same channel (e.g., CH_A) will be described below in relation to FIG. 6, and the case in which the first and second memory chips are connected to different channels (e.g., CH_A and CH_B) will be described below in relation to FIG. 11.

In an embodiment, HCPU 110 may transmit the internal program command CMD_p to two or more of first to k-th FCPUs 120_1 to 120_3. For example, HCPU 110 may transmit the internal program command CMD_p to first and second FCPUs 120_1 and 120_2. First FCPU 120_1 may receive the internal program command CMD_p from HCPU 110, and convert the first logical address into the first physical address corresponding thereto. First FCPU 120_1 may program the first data in a first memory chip (e.g., 200a_1) corresponding to the first physical address. Second FCPU 120_2 may receive the internal program command CMD_p from HCPU 110, and convert the first logical address into the second physical address corresponding thereto. Second FCPU 120_2 may program the first data in a second memory chip (e.g., 200c_1 or 200d_1) corresponding to the second physical address. The case in which the same first data is stored in memory chips controlled by two or more different FCPUs will be described below in relation to FIG. 12.

Although the same data, e.g., the first data, is programmed in two different memory chips as described above in relation to FIGS. 3 and 4, embodiments are not limited thereto and the same data may be programmed in three or more different memory chips.

Controller 100 may determine whether the first and second memory chips are performing an operation for data different from the first data, in response to the read request Req_r for the first data (S120). Controller 100 may receive the read request Req_r for the first data, from the host. HCPU 110 may generate an internal read command CMD_r by processing the read request Req_r received from the host, and transmit the internal read command CMD_r to FCPU 120 for performing an operation for the first and second memory chips. FCPU 120 may receive the internal read command CMD_r, and determine whether the first and second memory chips are performing an operation for data different from the first data.

When the first memory chip is performing an operation for data different from the first data, FCPU 120 may read the first data from the second memory chip (S130). Operations S120 and S130 will be described in detail below in relation to FIG. 5.

Upon determining to store the first data in only the first memory chip and when the first memory chip is performing an operation for data different from the first data, FCPU 120 should wait until the operation is terminated, to read the first data from the first memory chip. Therefore, a time taken to read the first data from the first memory chip may be increased. Particularly, since a time taken for a data program or erase operation may be longer than a time taken for a data read operation, when the first memory chip is performing a program or erase operation for data different from the first data, a time taken to read the first data from the first memory chip may be further increased.

The memory system according to an example embodiment may program the same data, e.g., the first data, in different memory chips, e.g., the first and second memory chips, and then read the first data selectively from one of the first and second memory chips. Therefore, even when the first memory chip is performing an operation for data different from the first data, the first data may be read from the second memory chip and thus a time taken to read the first data may be reduced.

Figure 5:
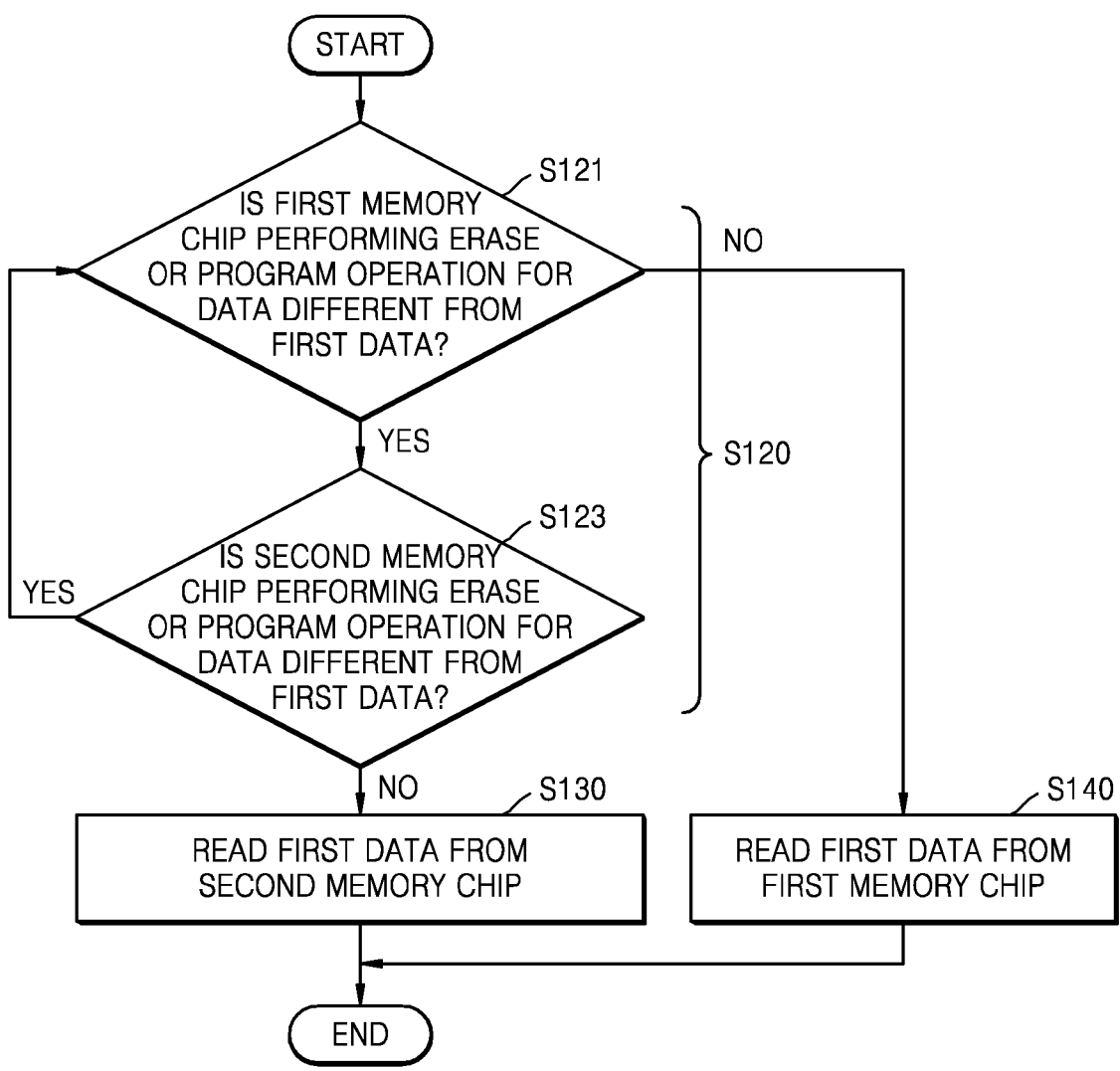
FIG. 5 is a flowchart for describing an example embodiment of operations S120 and S130 of FIG. 3.

FIG. 5 is a flowchart for describing an example embodiment of operations S120 and S130 of FIG. 3.

Referring to FIG. 5, operation S120 of determining whether the first and second memory chips are performing an operation for data different from the first data, by controller 100 in response to the read request Req_r for the first data, which is received from the host, may include determining whether the first memory chip is performing an erase or program operation for data different from the first data (S121), and determining whether the second memory chip is performing an erase or program operation for data different from the first data (S123). In an embodiment, when the first and second memory chips are performing an operation for data different from the first data, a busy flag may be generated and be temporarily stored in a local memory (e.g., local memory 130 of FIG. 2). Controller 100 may determine that the first memory chip is performing an operation for data different from the first data, based on the busy flag stored in local memory 130.

When the first memory chip is not performing an erase or program operation for data different from the first data, controller 100 may read the first data from the first memory chip (S140). For example, when the first memory chip is not performing any operation for data different from the first data, controller 100 may immediately read the first data from the first memory chip. Also, when the first memory chip is performing a read operation for data different from the first data, controller 100 may read the first data from the first memory chip after the read operation is terminated.

When the first memory chip is performing an erase or program operation for data different from the first data, controller 100 may determine whether the second memory chip is performing an erase or program operation for data different from the first data (S123). When the second memory chip is not performing an erase or program operation for data different from the first data, controller 100 may read the first data from the second memory chip (S130). For example, when the second memory chip is not performing any operation for data different from the first data, controller 100 may immediately read the first data from the second memory chip. Also, when the second memory chip is performing a read operation for data different from the first data, controller 100 may read the first data from the second memory chip after the read operation is terminated.

When the second memory chip is performing an erase or program operation for data different from the first data, controller 100 may determine whether the first memory chip is performing an erase or program operation for data different from the first data (S121).

Although operation S123 is performed after operation S121 in FIG. 5, embodiments are not limited thereto and operation S121 may be performed after operation S123 or operations S121 and S123 may be simultaneously performed.

The memory system according to an example embodiment may program the same data, e.g., the first data, in different memory chips, e.g., the first and second memory chips, and then read the first data selectively from one of the first and second memory chips, which is not performing an erase or program operation for data different from the first data. Therefore, a time taken to read the first data may be reduced.

Figure 6:
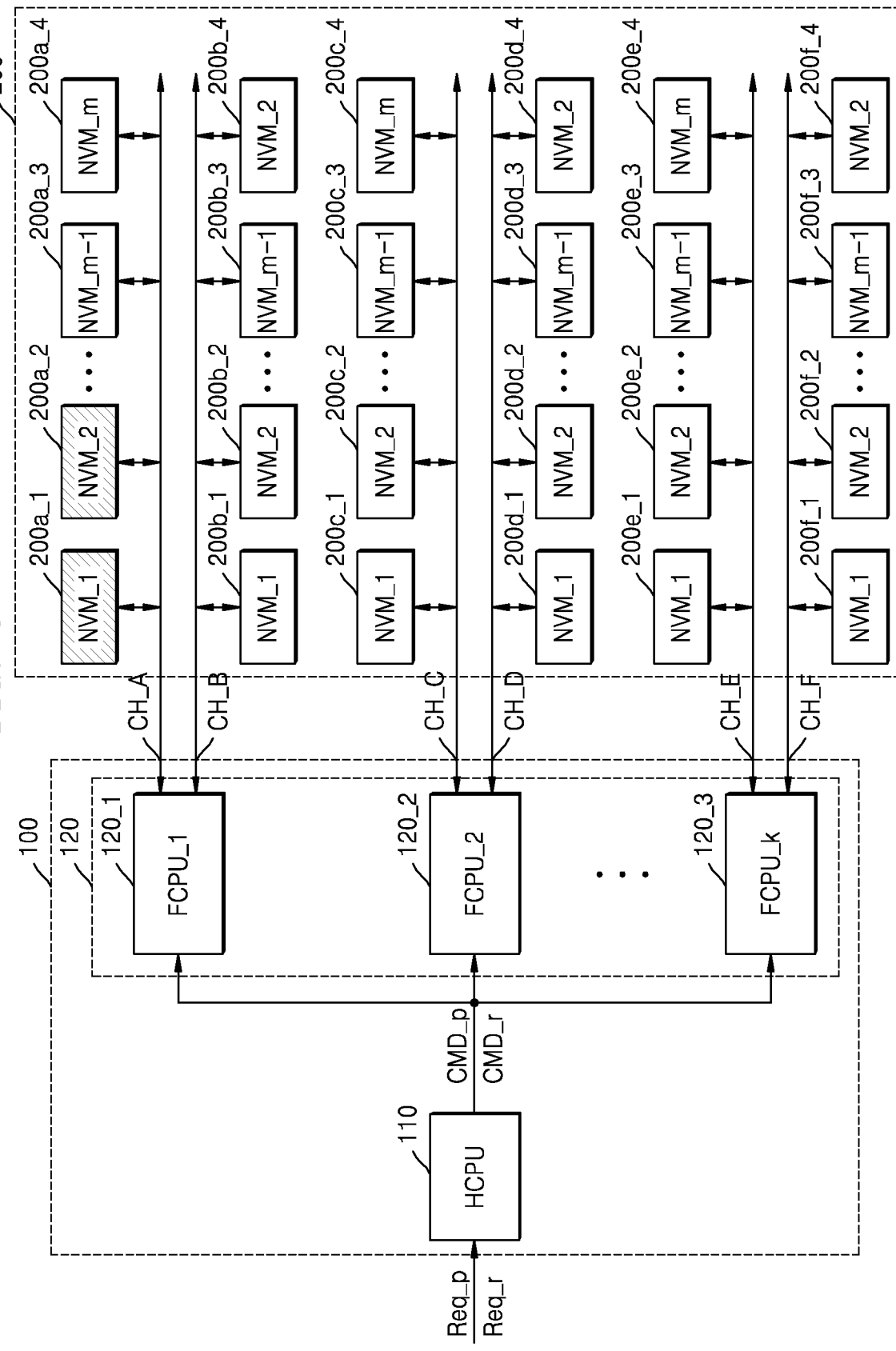
FIG. 6 is a block diagram of an example embodiment of a memory system.
Figure 7:
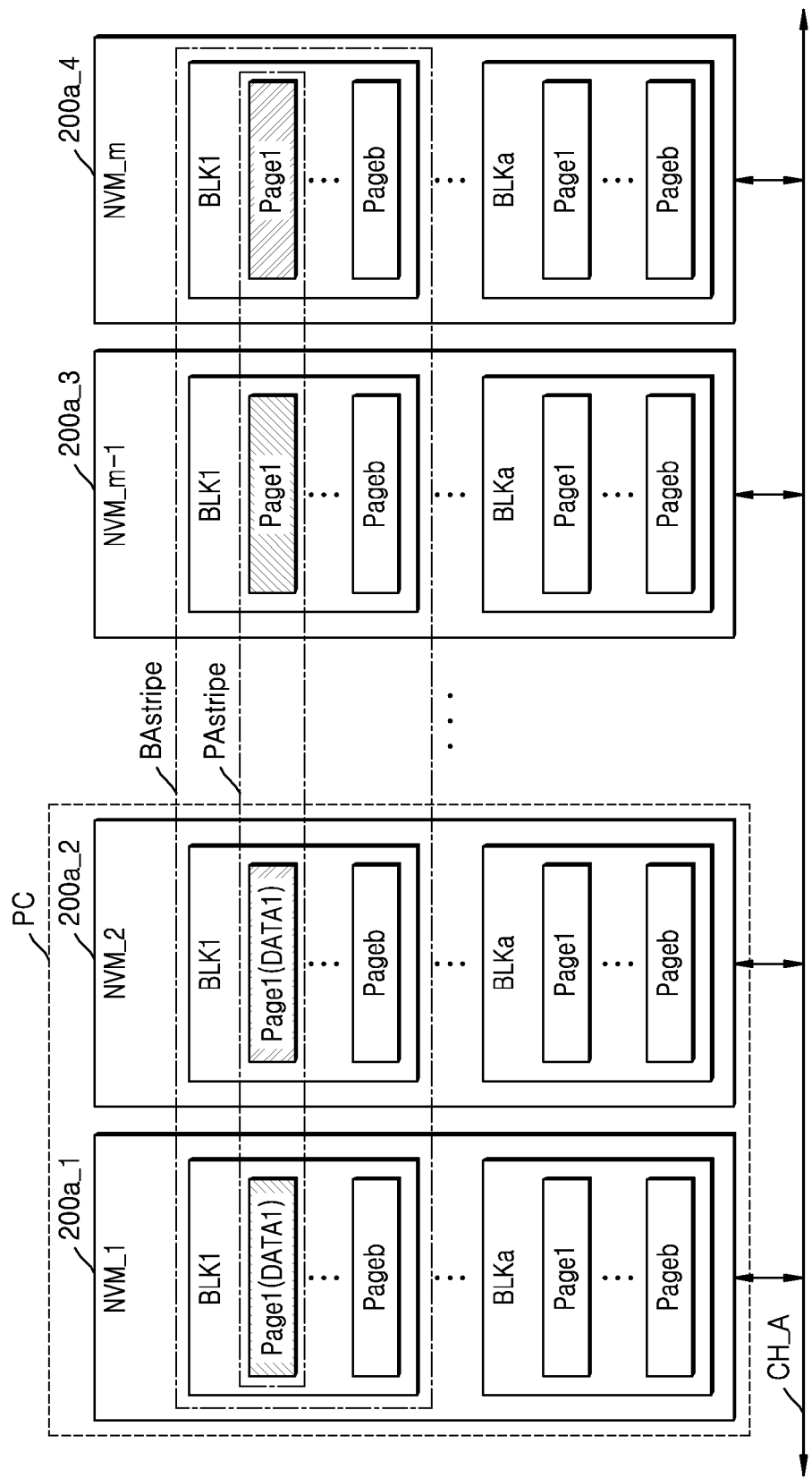
FIG. 7 is a block diagram for describing a first memory chip and a second memory chip which form a pair of chips in an example embodiment of a memory system.

FIG. 6 is a block diagram of example embodiment of a memory system. FIG. 7 is a block diagram for describing a first memory chip and a second memory chip which form a pair of chips in an example embodiment of a memory system. FIGS. 6 and 7 are block diagrams for describing an operation of storing the same data in a plurality of memory chips connected to the same channel (e.g., CH_A), as an example embodiment of operation S110 of FIG. 4.

Referring to FIG. 6, HCPU 110 may transmit the internal program command CMD_p to first FCPU 120_1 in response to the program request Req_p for first data. First FCPU 120_1 may program the first data in a first memory chip (e.g., 200a_1) and a second memory chip (e.g., 200a_2) connected to the first channel CH_A.

Referring to FIGS. 6 and 7, each of m memory chips 200a_1, 200a_2, 200a_3, and 200a_4 connected to the first channel CH_A may include first to a-th cell blocks BLK1 to BLKa, and each of the first to a-th cell blocks BLK1 to BLKa may include first to b-th pages Page1 to Pageb. In this case, a and b may be natural numbers equal to or greater than 2. In an embodiment, m may be an even number but is not limited thereto. Each of the first to a-th cell blocks BLK1 to BLKa may correspond to a data erase unit, and each of the first to b-th pages Page1 to Pageb may correspond to a data program or read unit in a cell block.

When controller 100 receives the program request Req_p, data, and a logical address from a host, the data may be stored in a buffer (e.g., local memory 130) of controller 100 and then be programmed in memory chips 200a_1, 200a_2, 200a_3, and 200a_4 in a page array stripe (PAstripe) unit.

Pages provided at the same location of memory chips 200a_1, 200a_2, 200a_3, and 200a_4 (e.g., pages having the same physical address) may form a page group and, in this case, a PAstripe may refer to data stored in a page group. For example, first pages Page1 included in the first cell blocks BLK1 of memory chips 200a_1, 200a_2, 200a_3, and 200a_4 may form a page group, and data of a PAstripe unit may be stored in the page group including the first pages Page1.

When controller 100 receives the read request Req_r from the host, data may be read from memory chips 200a_1, 200a_2, 200a_3, and 200a_4 in a PAstripe unit. For example, the data stored in the first pages Page1 included in the first cell blocks BLK1 of memory chips 200a_1, 200a_2, 200a_3, and 200a_4 may be read together.

Cell blocks provided at the same location of memory chips 200a_1, 200a_2, 200a_3, and 200a_4 (e.g., cell blocks having the same physical address) may form a block group and, in this case, a block array stripe (BAstripe) may refer to data stored in a block group. For example, the first cell blocks BLK1 of memory chips 200a_1, 200a_2, 200a_3, and 200a_4 may form a block group, and data may be erased in a BAstripe unit when controller 100 receives an erase request from the host.

In an embodiment, first data DATA1 may be programmed in the first pages Page1 provided at the same location of the first and second memory chips 200a_1 and 200a_2. Therefore, locations at which the first data DATA1 is stored in first and second memory chips 200a_1 and 200a_2 may have the same physical address.

When controller 100 receives the program request Req_p for the first data DATA1 from the host, data including the first data DATA1 and forming a PAstripe is stored in the buffer (e.g., local memory 130) of controller 100. First FCPU 120_1 may program the PAstripe stored in the buffer, in pages of memory chips 200a_1, 200a_2, 200a_3, and 200a_4.

In this case, first FCPU 120_1 may preferentially store the data in odd-numbered memory chips (e.g., 200a_1 and 200a_3) and then store the data in even-numbered memory chips (e.g., 200a_2 and 200a_4) based on the order of the memory chips connected to the first channel CH_A. However, embodiments are not limited thereto and the data may be stored in the even-numbered memory chips (e.g., 200a_2 and 200a_4) and then be stored in the odd-numbered memory chips (e.g., 200a_1 and 200a_3).

In an embodiment, first and second memory chips 200a_1 and 200a_2 sequentially connected to the first channel CH_A may form a pair of chips PC, and first memory chip 200a_1 may be an odd-numbered memory chip connected to the first channel CH_A whereas second memory chip 200a_2 may be an even-numbered memory chip connected to the first channel CH_A. Therefore, the data may be stored not simultaneously but sequentially in first and second memory chips 200a_1 and 200a_2. After the same first data DATA1 is programmed in first and second memory chips 200a_1 and 200a_2, when first memory chip 200a_1 is performing a program operation for data different from the first data DATA1, second memory chip 200a_2 is not performing a program operation and thus may perform a read operation for the first data DATA1.

In an embodiment, when the first data DATA1 is programmed in each of the first pages Page1 provided at the same location of first and second memory chips 200a_1 and 200a_2, in an erase operation for the first data DATA1, since the erase operation is performed in a BAstripe unit, the first data DATA1 stored in first and second memory chips 200a_1 and 200a_2 may be erased simultaneously therefrom.

However, the memory system according to an example embodiment of embodiments are not limited to the programming of the same data in pages having the same physical address of first and second memory chips 200a_1 and 200a_2 sequentially connected to the same channel (e.g., CH_A). The same data may be stored in pages having different physical addresses of first and second memory chips 200a_1 and 200a_2 sequentially connected to the same channel CH_A, or in a plurality of memory chips not sequentially connected to the same channel CH_A.

Figures 8, 9:
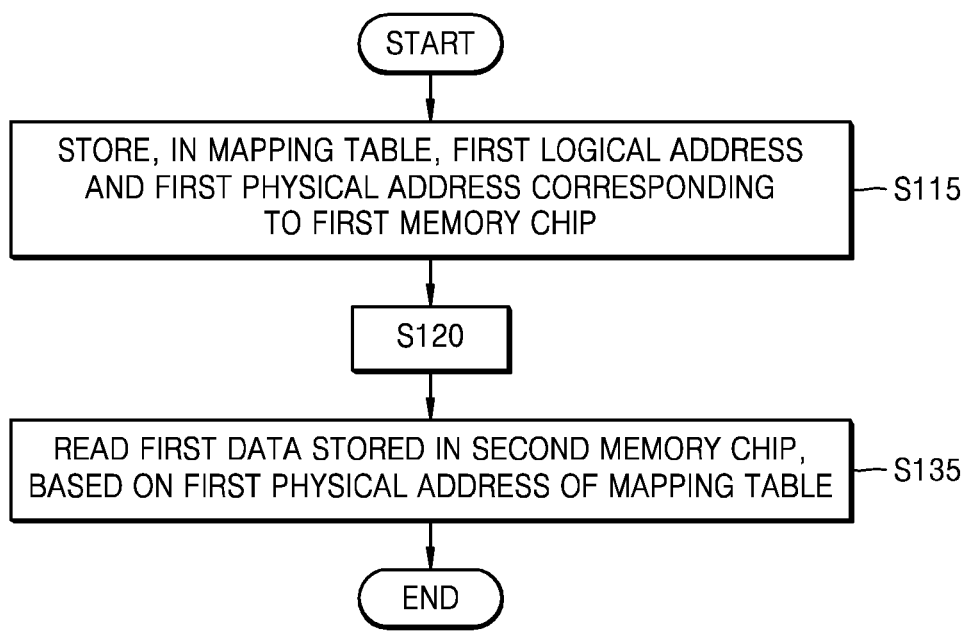
FIG. 8 is a flowchart of an example embodiment of an operating method of a memory system.
FIG. 9 shows a mapping table including mapping information between logical addresses and physical addresses of pages to store data therein, in an example embodiment of a memory system

FIG. 8 is a flowchart of example embodiment of an operating method of a memory system, and is a flowchart for describing an example embodiment of operations S110 and S130 of FIG. 4. FIG. 9 shows mapping table 140 including mapping information between logical addresses and physical addresses of pages to store data therein, in an example embodiment of a memory system. For example, FIG. 9 shows mapping information between logical page numbers (LPNs) and physical page numbers (PPNs).

Referring to FIGS. 6, 8, and 9, controller 100 may store a first logical address received from the host, and a first physical address corresponding to a first memory chip, in mapping table 140 (S115). first FCPU 120_1 having receive the internal program command CMD_p may convert the first logical address into the first physical address and a second physical address corresponding thereto, and program first data in first memory chip 200a_1 corresponding to the first physical address and second memory chip 200a_2 corresponding to the second physical address. In this case, first FCPU 120_1 may store the first logical address and the first physical address corresponding to first memory chip 200a_1, in mapping table 140.

Mapping table 140 may store mapping information indicating data storage locations in non-volatile memory chips 200. For example, in mapping table 140, logical addresses Page_ADD_L1 to Page_ADD_Lb for designating pages to program data therein may be 1:1 mapped to physical addresses Page_ADD_P1 to Page_ADD_Pb indicating physical locations of the pages to program the data therein.

In this case, upon determining to program the same first data in different memory chips (e.g., first and second memory chips 200a_1 and 200a_2), the first physical address corresponding to a page of first memory chip 200a_1 to store the first data therein may be stored in mapping table 140, but the second physical address corresponding to a page of second memory chip 200a_2 to store the first data therein may not be stored in mapping table 140. However, upon determining to store the same data in different memory chips, information about the number of memory chips to store the data therein may be additionally stored in mapping table 140, and calculation information used to calculate the second physical address based on the first physical address may be stored in a local memory (e.g., local memory 130 of FIG. 2).

For example, as in FIG. 7, the first data DATA1 to be programmed in different memory chips may be programmed in the first page Page1 of the first cell block BLK1 included in first memory chip 200a_1, and in the first page Page1 of the first cell block BLK1 included in second memory chip 200a_2. In mapping table 140, a first logical address (e.g., PAGE_ADD_L1) for designating a page to program the first data DATA1 therein, and a first physical address (e.g., PAGE_ADD_P1) corresponding to the first page Page1 of the first cell block BLK1 included in first memory chip 200a_1 may be stored, and information indicating that the first data DATA1 is stored in a total of two memory chips, e.g., first and second memory chips 200a_1 and 200a_2, may be additionally stored. Since the first data DATA1 is programmed in the same physical location of first and second memory chips 200a_1 and 200a_2, even when a second physical address corresponding to the first page Page1 of the first cell block BLK1 included in second memory chip 200a_2 is not additionally stored, first FCPU 120_1 may calculate the second physical address based on the first physical address PAGE_ADD_P1.

Controller 100 may determine whether first and second memory chips 200a_1 and 200a_2 are performing an operation for data different from the first data DATA1, in response to the read request Req_r for the first data DATA1 (S120). When the read request Req_r for the first data DATA1 is received from the host, HCPU 110 may transmit the internal read command CMD_r to first FCPU 120_1.

Controller 100 may read the first data DATA1 from second memory chip 200a_2 based on the first physical address PAGE_ADD_P1 of mapping table 140 (S135). In an embodiment, when first memory chip 200a_1 is performing an operation for data different from the first data DATA1, first FCPU 120_1 may calculate the second physical address based on the first physical address PAGE_ADD_P1 of mapping table 140, and read the first data DATA1 from second memory chip 200a_2 corresponding to the second physical address (S135).

However, in the memory system according to an example embodiment, upon determining to program the same first data in first and second memory chips 200a_1 and 200a_2, the second physical address corresponding to second memory chip 200a_2 may also be stored in mapping table 140.

FIGS. 10A and 10B show a first mapping table 140_1 and a second mapping table 140_2 including mapping information between logical addresses and physical addresses of pages to store data therein in an example embodiment of a memory system. Unlike FIG. 9, FIGS. 10A and 10B show that, upon determining to program the same data in a plurality of memory chips, mapping information between logical addresses and physical addresses are stored in separate mapping tables.

Referring to FIGS. 10A and 10B, regardless of whether data is programmed in one memory chip or in a plurality of memory chips, in first mapping table 140_1, logical addresses Page_ADD_L1 to Page_ADD_Lb for designating pages to program data therein may be 1:1 mapped to physical addresses Page_ADD_P1 to Page_ADD_Pb indicating physical locations of the pages to program the data therein.

Upon determining to program the same data in a plurality of memory chips, in second mapping table 140_2, logical addresses Page_ADD_L1 and Page_ADD_Lb for designating pages to program data therein may be 1:1 mapped to first physical addresses Page_ADD_P1 and Page_ADD_Pb indicating physical locations of the pages to program the data therein. Information about the number of memory chips to store the data therein may be additionally stored in second mapping table 140_2. Calculation information used to calculate a second physical address corresponding to a second memory chip other than the first memory chip corresponding to the first physical addresses Page_ADD_P1 and Page_ADD_Pb based on the first physical addresses Page_ADD_P1 and Page_ADD_Pb may be stored in a local memory (e.g., local memory 130 of FIG. 2). Using the calculation information, a FCPU (e.g., FCPU 120 of FIG. 3) may calculate the second physical address based on the first physical addresses Page_ADD_P1 and Page_ADD_Pb, and read data from a second memory chip corresponding to the second physical address.

FIG. 11 is a block diagram of example embodiment of a memory system. FIG. 11 is a block diagram for describing an operation of storing the same data in a plurality of memory chips, operations of which are controlled by the same FCPU (e.g., the first FCPU 120_1), as an example embodiment of operation S110 of FIG. 4.

Referring to FIG. 11, HCPU 110 may transmit the internal program command CMD_p to first FCPU 120_1 in response to the program request Req_p for first data. First FCPU 120_1 may program the first data in a first memory chip (e.g., 200a_1) connected to the first channel CH_A and in a second memory chip (e.g., 200b_1) connected to the second channel CH_B.

First FCPU 120_1 may convert a first logical address into a first physical address and a second physical address corresponding thereto, and program the first data in first memory chip 200a_1 corresponding to the first physical address and second memory chip 200b_1 corresponding to the second physical address. First FCPU 120_1 may store the first logical address and the first physical address corresponding to first memory chip 200a_1 in a mapping table. The mapping table may include mapping table 140 of FIG. 9, or first and second mapping tables 140_1 and 140_2 of FIG. 10. Mapping information between first physical addresses and second physical addresses may be stored in a local memory (e.g., local memory 130 of FIG. 2), and FCPU 120 may calculate the second physical address based on the first physical address by using the mapping information. In an embodiment, the first data may be programmed in first and second memory chips 200a_1 and 200b_1 having the same physical address on the basis of the first and second channels CH_A and CH_B connected to first FCPU 120_1, but is not limited thereto.

Therefore, first FCPU 120_1 may determine whether first and second memory chips 200a_1 and 200b_1 are performing an operation for data different from the first data, and then read the first data from first memory chip 200a_1 by using the first physical address, or read the first data from second memory chip 200b_1 by calculating the second physical address based on the first physical address.

Figure 12:
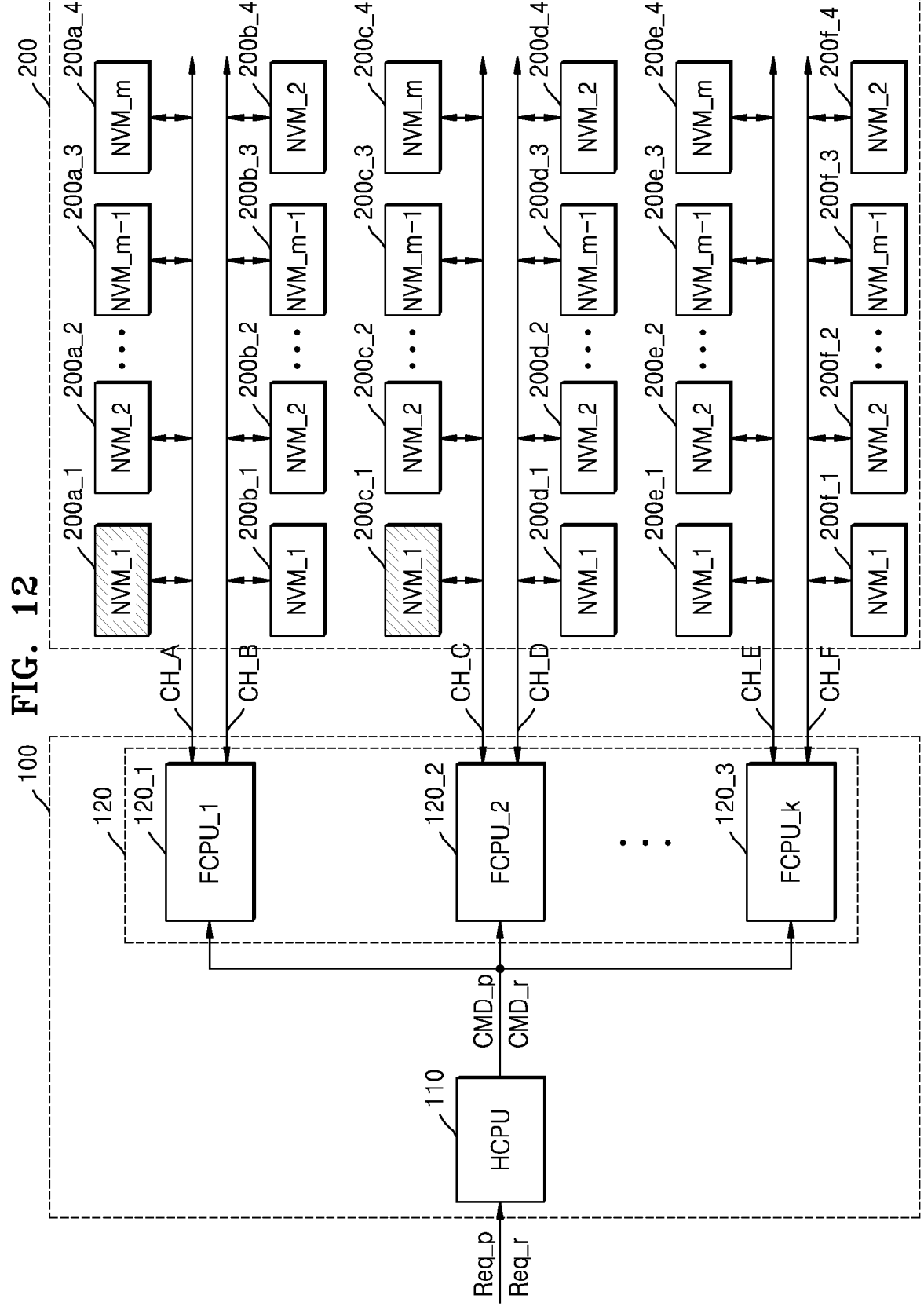
FIG. 12 is a block diagram of an example embodiment of a memory system.

FIG. 12 is a block diagram of example embodiment of a memory system. FIG. 12 is a block diagram for describing an operation of storing the same data in a plurality of memory chips, operations of which are controlled by different FCPUs (e.g., first and second FCPUs 120_1 and 120_2), as an example embodiment of operation S110 of FIG. 4.

Referring to FIG. 12, HCPU 110 may transmit the internal program command CMD_p to different FCPUs, e.g., first and second FCPUs 120_1 and 120_2, in response to the program request Req_p for first data. First FCPU 120_1 may program the first data in a first memory chip (e.g., 200a_1), and second FCPU 120_2 may program the first data in a second memory chip (e.g., 200c_1).

First FCPU 120_1 may convert a first logical address into a first physical address corresponding thereto, and second FCPU 120_2 may convert the first logical address into a second physical address corresponding thereto. First FCPU 120_1 may program the first data in first memory chip 200a_1 corresponding to the first physical address, and second FCPU 120_2 may program the first data in second memory chip 200c_1 corresponding to the second physical address.

First FCPU 120_1 may store the first logical address and the first physical address corresponding to first memory chip 200a_1 in a mapping table, and second FCPU 120_2 may store the first logical address and the second physical address corresponding to second memory chip 200c_1 in the mapping table. The mapping table will be described below in relation to FIGS. 13 and 14.

HCPU 110 may transmit the internal read command CMD_r to first or second FCPU 120_1 or 120_2 in response to the read request Req_r for the first data. For example, HCPU 110 may determine whether first and second memory chips 200a_1 and 200c_1 are performing an operation for data different from the first data, based on a busy flag stored in a local memory (e.g., local memory 130), and transmit the internal read command CMD_r to second FCPU 120_2 to program the first data in second memory chip 200c_1 which is not performing a program or erase operation for data different from the first data.

In an embodiment, HCPU 110 may transmit the internal read command CMD_r to both of first and second FCPUs 120_1 and 120_2, and control first or second memory chip 200a_1 or 200c_1 to read the first data in such a manner that one of first and second FCPUs 120_1 and 120_2, which is capable of reading the first data more rapidly than the other, reads the first data.

Comparing FIGS. 6, 11, and 12, a read operation speed for the first data may be increased in a case in which the same first data is programmed in a plurality of memory chips connected to different channels and controlled by the same FCPU (e.g., program type B of FIG. 19) compared to a case in which the same first data is programmed in a plurality of memory chips connected to the same channel (e.g., program type A of FIG. 19), and may be increased even further in a case in which the same first data is programmed in a plurality of memory chips controlled by different FCPUs (e.g., program type C of FIG. 19) because mutual influence between operations of the memory chips to store the first data therein is reduced. However, controller 100 may control the operations of the memory chips to program the same first data therein more easily in program type B than in program type C, and may control the operations of the memory chips to program the same first data therein even more easily in program type A than in program type B.

In addition, when the number of memory chips to program the same first data therein is increased, since the possibility that at least one or more of the memory chips is not performing an operation for data different from the first data is increased, a read operation speed for the first data may also be increased.

Therefore, based on importance of the first data, the number of memory chips to program the first data therein may be determined and a method of determining a plurality of memory chips to store the first data therein may vary. The importance of the first data will be described below in relation to FIG. 15 and the like.

Figures 13, 14:
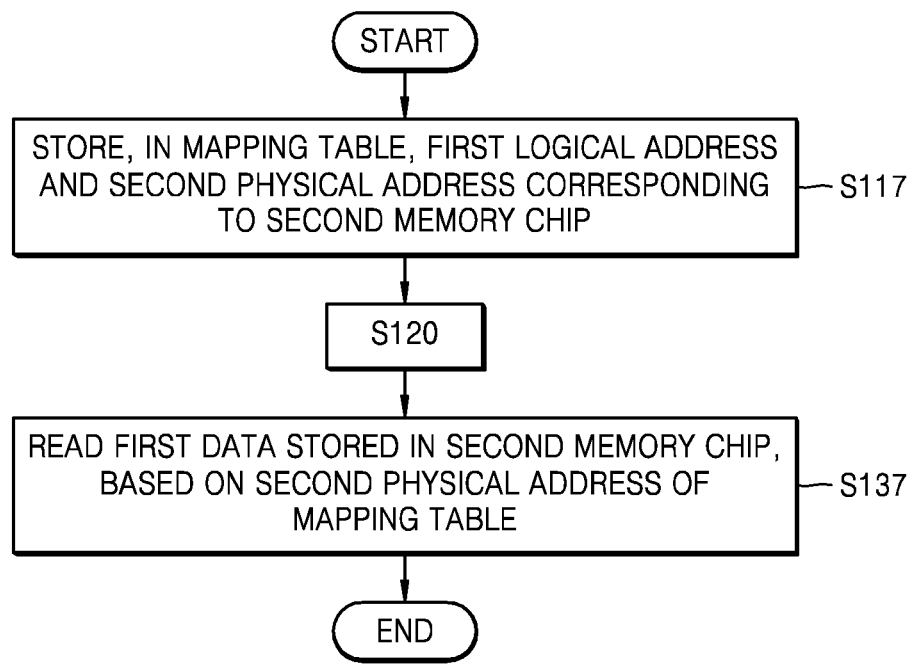
FIG. 13 is a flowchart of an operating method of an example embodiment of a memory system
FIG. 14 shows a mapping table including mapping information between logical addresses and physical addresses of pages to store data therein, in an example embodiment of a memory system.

FIG. 13 is a flowchart of an example embodiment of an operating method of a memory system, and is a flowchart for describing an example embodiment of operations S110 and S130 of FIG. 4. FIG. 14 shows a mapping table 140a including mapping information between logical addresses and physical addresses of pages to store data therein, in an example embodiment of a memory system.

Referring to FIGS. 12 to 14, controller 100 may store a first logical address received from the host and a second physical address corresponding to a second memory chip, in mapping table 140a (S117). When the program request Req_p for first data and a first logical address (e.g., PAGE_ADD_L1) are received from the host, HCPU 110 may transmit the internal program command CMD_p to some of a plurality of FCPUs 120 (e.g., first and second FCPUs 120_1 and 120_2). First FCPU 120_1 may convert the first logical address PAGE_ADD_L1 into a first physical address (e.g., PAGE_ADD_P1_1), and store the first logical address PAGE_ADD_L1 and the first physical address PAGE_ADD_P1_1 corresponding to first memory chip 200a_1 in mapping table 140a. Second FCPU 120_2 may convert the first logical address PAGE_ADD_L1 into a second physical address (e.g., PAGE_ADD_P1_2), and store the first logical address PAGE_ADD_L1 and the second physical address PAGE_ADD_P1_2 corresponding to second memory chip 200c_1, in mapping table 140a.

Mapping table 140a may store mapping information indicating data storage locations in non-volatile memory chips 200. For example, upon determining to store data in one memory chip, logical addresses (e.g., Page_ADD_L2 and Page_ADD_L3) and physical addresses (e.g., Page_ADD_P2 and Page_ADD_P3) corresponding thereto may be stored in mapping table 140a in 1:1 correspondence. Upon determining to store data in a plurality of memory chips, logical addresses (e.g., Page_ADD_L1 and Page_ADD_Lb) and physical addresses (e.g., Page_ADD_P1_1 and Page_ADD_P1_2, and Page_ADD_Pb_1, Page_ADD_Pb_2, and Page_ADD_Pb_3) may be stored in mapping table 140a in 1:i correspondence. In this case, i may denote the number of memory chips to store the same data therein.

When the read request Req_r for the first data is received from the host, controller 100 may determine whether first and second memory chips 200a_1 and 200c_1 are performing an operation for data different from the first data, in response to the read request Req_r (S120).

Controller 100 may read the first data from second memory chip 200c_1 based on the second physical address PAGE_ADD_P1_2 of mapping table 140a (S137). In an embodiment, when first memory chip 200a_1 is performing an operation for data different from the first data, second FCPU 120_2 may read the first data from second memory chip 200c_1 corresponding to the second physical address PAGE_ADD_P1_2 in the mapping table 140a.

Figure 15:
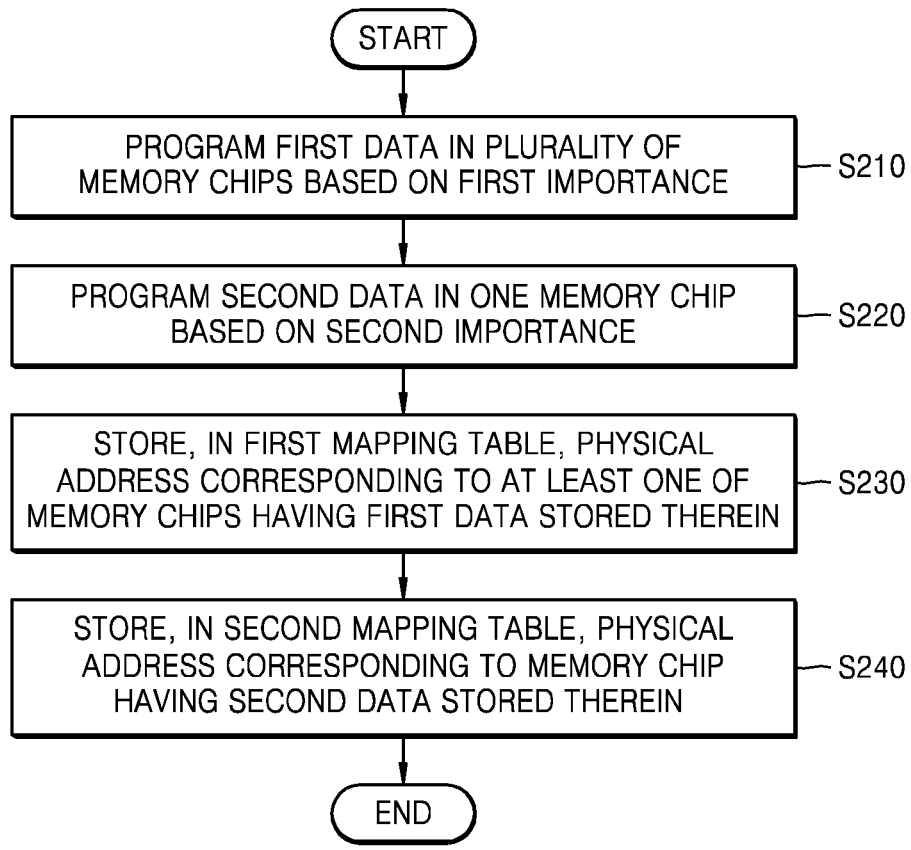
FIG. 15 is a flowchart of an example embodiment of an operating method of a memory system.

FIG. 15 is a flowchart of an example embodiment of an operating method of a memory system.

Referring to FIGS. 3 and 15, controller 100 may receive the program request Req_p, first data, a first logical address, second data, and a second logical address from the host. HCPU 110 may generate the internal program command CMD_p by processing the program request Req_p received from the host.

FCPU 120 may program the first data in a plurality of different memory chips based on first importance of the first data (S210), and program the second data in one memory chip based on second importance of the second data (S220). The second importance may be lower than or less than the first importance. In this case, the first data may be programmed in a plurality of memory chips by using at least one of the methods described above in relation to FIGS. 6, 11, and 12.

Data importance may serve as a criterion used when FCPU 120 determines whether to store data in a plurality of memory chips or only in a single memory chip. For example, data which requires a short time to read may have high importance. In an embodiment, FCPU 120 may store the same data in a number of memory chips in proportion to importance of the data.

In an embodiment, importance information of the first data may be included in the program request Req_p for the first data, which is received from the host, or may be received from the host as a separate command. In an embodiment, the importance information of the first data may be generated in the memory system based on the number of times that the read request Req_r for the first data is received.

FCPU 120 may convert the first logical address into physical addresses corresponding to a plurality of memory chips to store the first data therein, and store the first logical address and the physical address corresponding to at least one of the memory chips in a first mapping table (S230). The first mapping table may include mapping table 140 of FIG. 9, first and second mapping tables 140_1 and 140_2 of FIG. 10, or mapping table 140a of FIG. 14.

FCPU 120 may convert the second logical address into a physical address corresponding to one memory chip to store the second data therein, and store the second logical address and the converted physical address in a second mapping table (S240).

The first and second mapping tables related to FIG. 15 may be configured as one mapping table like mapping table 140 of FIG. 9 or mapping table 140a of FIG. 14, or as different mapping tables like first and second mapping tables 140_1 and 140_2 of FIG. 10.

Figure 16:
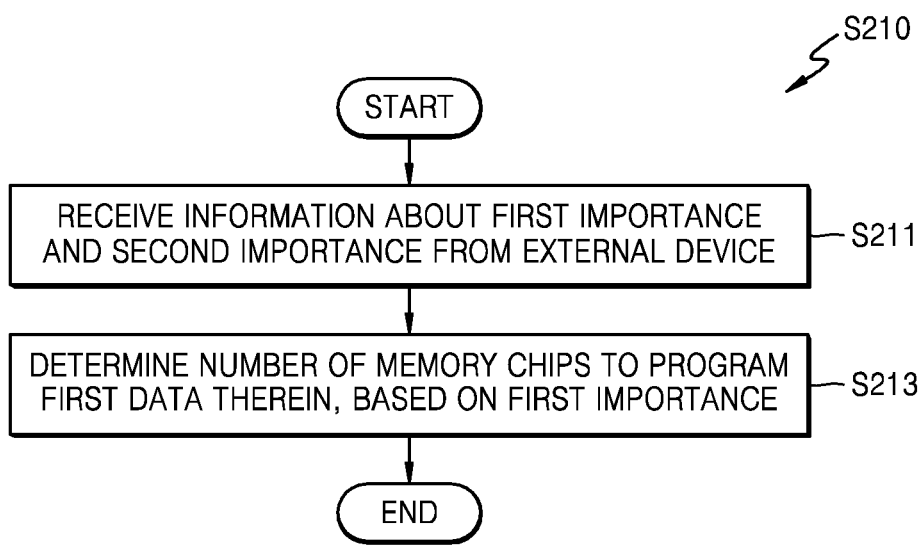
FIG. 16 is a flowchart for describing an example embodiment of operation S210 of FIG. 15.

FIG. 16 is a flowchart for describing an example embodiment of operation S210 of FIG. 15.

Referring to FIG. 16, controller 100 may receive information about first importance of first data and second importance of second data from an external device, e.g., the host (S211). In an embodiment, the information about the first importance and the second importance may be included in a program request (e.g., the program request Req_p of FIG. 1), which is received from the host, but is not limited thereto and may be received from the host as a separate command different from the program request. In an embodiment, the information about the first importance and the second importance, which is received from the external device, may include information indicting the number of memory chips to program each of the first data and the second data therein, but is not limited thereto. In an embodiment, the memory system may include an importance table, and determine the numbers of memory chips to program the first data and the second data therein, based on the information about the first importance and the second importance, which is received from the external device, and the importance table.

Controller 100 may determine the number of memory chips to program the first data therein, based on the first importance (S213). Controller 100 may determine the number of memory chips to program the second data therein, based on the second importance. However, the memory system according to an example embodiment is not limited thereto, and controller 100 may select a plurality of memory chips to program the first data therein, among non-volatile memory chips, based on the first importance. A description thereof will be provided below in relation to FIG. 19.

However, the memory system according to an example embodiment is not limited to the receiving of the information about the first importance and the second importance from the external device. For example, the memory system may collect information about data which is repeatedly read. The memory system may generate information about importance of the first data and information about importance of the second data based on the numbers of times that read requests for the first data and the second data are received, and store the same in a local memory.

When the information about the first importance is received from the external device after the first data is already programmed, the memory system according to an example embodiment of the inventive concept may erase the first data from a part of a plurality of memory chips to program the first data therein, based on the received information about the first importance. For example, the operation of erasing the first data may be performed together with a garbage collection operation. Otherwise, when the information about the first importance and the second importance is received from the external device after the first data and the second data are already programmed, the memory system according to an example embodiment may further program the first data and the second data in additional memory chips based on the received information about the first importance and the second importance.

Figure 17:
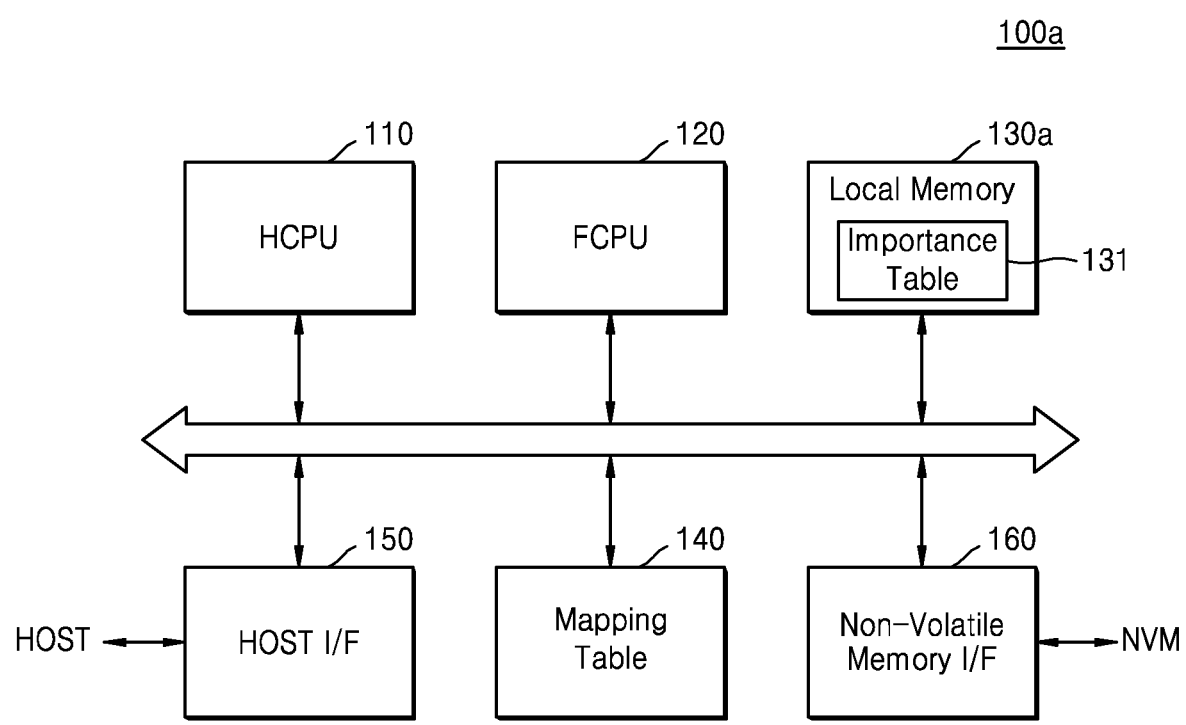
FIG. 17 is a block diagram of a controller modified from the controller of FIG. 1.

FIG. 17 is a block diagram of a controller 100a modified from controller 100 of FIG. 1. The elements described above in relation to FIG. 2 will not be repeatedly described in relation to FIG. 17. FIGS. 18A, 18B, and 19 show importance tables 131a, 131b, and 131c stored in a local memory 130a of an example embodiment of a memory system.

Referring to FIG. 17, controller 100a may include HCPU 110, FCPU 120, local memory 130a, mapping table 140, host interface 150, and memory interface 160. Local memory 130a may store an importance table 131, and the importance table 131 may store information about a data programming method corresponding to importance information of data to be programmed in non-volatile memory chips. FCPU 120 may determine the number of memory chips to program first data therein, based on importance table 131. Upon determining to program the first data in a plurality of memory chips, FCPU 120 may select a plurality of memory chips to program the first data therein, based on importance table 131.

Referring to FIGS. 17 and 18A, importance table 131a may store importance information DATA_I of data and the number of different memory chips to program the data therein. For example, the importance information DATA_I may have a total of four values from 0 to 3, and indicate high importance in a direction from 0 to 3. Therefore, a large value of the importance information DATA_I may indicate that a read operation of the data should be rapidly performed. However, the above description is merely for convenience of explanation and the memory system according to an example embodiment is not limited thereto.

Importance table 131a may be configured in such a manner that the number of different memory chips to program the same data therein is increased in proportion to the value of the importance information DATA_I of the data to be programmed. When the number of memory chips to program the same data therein is increased, the chances increase that at least one of the memory chips may not be performing an operation for data other than the data for which a read request is received, and thus the possibility of rapidly responding to the read request received from the host may be increased.

Referring to FIGS. 17 and 18B, importance table 131b may store importance information DATA_I of data and the number of different memory chips to program the data therein. For example, the importance information DATA_I may have a total of four values from 0 to 3. Importance table 131b may be configured to program the data in two memory chips when the importance information DATA_I of the data to be programmed has a value equal to or greater than a certain value (e.g., 2), and to program the data in one memory chip when the importance information DATA_I of the data to be programmed has a value less than the certain value.

Since a total capacity of non-volatile memory chips may be reduced when the same data is programmed in a plurality of memory chips, the certain value may be determined in consideration of both of rapid reading of the data and a gain in the total capacity of the non-volatile memory chips.

Referring to FIG. 17 and FIG. 19, importance table 131c may store importance information DATA_I of data and information about a data programming method. For example, the importance information DATA_I may have a total of four values from 0 to 3, and indicate higher importance in a direction from 0 to 3. Importance table 131c may be configured to program the data in one memory chip (e.g., program type N) when the importance information DATA_I has a value 0. Importance table 131c may be configured to program the same data in a plurality of memory chips connected to the same channel (e.g., program type A) as described above in relation to FIG. 6 when the importance information DATA_I has a value 1. Importance table 131c may be configured to program the same data in a plurality of memory chips connected to different channels and controlled by the same FCPU (e.g., program type B) as described above in relation to FIG. 11 when the importance information DATA_I has a value 2. Importance table 131c may be configured to program the same data in a plurality of memory chips controlled by different FCPUs (e.g., program type C) as described above in relation to FIG. 12 when the importance information DATA_I has a value 3.

Importance table 131 of FIG. 17 may include at least one of importance table 131a of FIG. 18A, importance table 131b of FIG. 18B, and importance table 131c of FIG. 19.

Based on a memory system and an operating method thereof, according to the inventive concept, since data may be programmed in a plurality of different memory chips and be read from one of the memory chips, a read operation speed may be increased. Furthermore, since it is determined whether to program data in a plurality of memory chips, based on importance information of the data, excessive consumption of the capacity of non-volatile memory chips may be prevented.

While the inventive concept has been particularly shown and described with reference to embodiments thereof, it will be understood that various changes in form and details may be made therein without departing from the spirit and scope of the following claims.

What is claimed is:

1. An operating method of a memory system comprising a first memory chip and a second memory chip, the operating method comprising:
   programming first data in both the first memory chip and the second memory chip in response to a program request for the first data so that the first data is stored in both the first memory chip and the second memory chip as same data;
   determining, in response to a read request for the first data, whether the first memory chip and the second memory chip are performing an erase operation or a program operation for second data different from the first data;
   reading the first data from the second memory chip in response to the read request for the first data, when the first memory chip is performing the erase operation or the program operation for the second data; and
   reading the first data from the first memory chip in response to the read request for the first data after the first memory chip terminates a read operation for the second data, when the first memory chip is performing the read operation for the second data.

2. The operating method of claim 1, wherein the first memory chip and the second memory chip are connected to different channels.

3. The operating method of claim 2, wherein each of the first memory chip and the second memory chip comprises a plurality of pages, and
   wherein the programming of the first data in both the first memory chip and the second memory chip comprises programming the first data in a first page of the first memory chip, and programming the first data in a second page of the second memory chip having a same physical address as the first page.

4. The operating method of claim 1, wherein the first memory chip and the second memory chip are connected to a same channel.

5. The operating method of claim 4, wherein each of the first memory chip and the second memory chip comprises a plurality of pages, and
   wherein the programming of the first data in both the first memory chip and the second memory chip comprises programming the first data in a first page of the first memory chip, and programming the first data in a second page of the second memory chip having a same physical address as the first page.

6. The operating method of claim 1, wherein the determining whether the first memory chip and the second memory chip are performing the erase operation or the program operation for the second data comprises determining whether the first memory chip and the second memory chip are performing the erase operation or the program operation for the second data based on a busy flag stored in a controller controlling the first memory chip and the second memory chip.

7. The operating method of claim 1, wherein the programming of the first data further comprises:
receiving a first logical address;
converting the first logical address into a first physical address corresponding to the first memory chip; and
storing the first logical address and the first physical address in a mapping table.

8. The operating method of claim 7, wherein the reading of the first data from the second memory chip is based on the first physical address of the mapping table.

9. The operating method of claim 7, wherein the storing in the mapping table further comprises storing, in the mapping table, a second physical address corresponding to the second memory chip, and
wherein the reading of the first data from the second memory chip is based on the second physical address of the mapping table.

10. An operating method of a memory system comprising a plurality of memory chips, the operating method comprising:
programming first data in each of the plurality of memory chips in response to a program request for the first data;
determining, in response to a read request for the first data, whether the plurality of memory chips are performing an erase operation or a program operation for second data different from the first data;
reading the first data, in response to the read request for the first data, from one memory chip of the plurality of memory chips when another memory chip of the plurality of memory chips is performing the erase operation or the program operation for the second data; and
reading the first data, in response to the read request for the first data, from the one memory chip of the plurality of memory chips after the one memory chip of the plurality of memory chips terminates a read operation for the second data, when the one memory chip of the plurality of memory chips is performing the read operation for the second data.

11. The operating method of claim 10, wherein the programming of the first data in each of the plurality of memory chips comprises programming the first data in a first memory chip and a second memory chip connected to different channels.

12. The operating method of claim 11, wherein each of the first memory chip and the second memory chip comprises a plurality of pages, and
wherein the programming of the first data in the first memory chip and the second memory chip comprises programming the first data in a first page of the first memory chip, and programming the first data in a second page of the second memory chip having a same physical address as the first page.

13. The operating method of claim 10, wherein the programming of the first data in each of the plurality of memory chips comprises programming the first data in a first memory chip and a second memory chip connected to a same channel.

14. The operating method of claim 13, wherein each of the first memory chip and the second memory chip comprises a plurality of pages, and
wherein the programming of the first data in the first memory chip and the second memory chip comprises programming the first data in a first page of the first memory chip, and programming the first data in a second page of the second memory chip having a same physical address as the first page.

15. The operating method of claim 10, further comprising generating a busy flag when at least one of the plurality of memory chips is performing the erase operation or the program operation for data different from the first data.

16. The operating method of claim 10, wherein the programming of the first data further comprises:
receiving a first logical address;
converting the first logical address into a first physical address corresponding to the another memory chip of the plurality of memory chips; and
storing the first logical address and the first physical address in a mapping table.

17. The operating method of claim 16, wherein the reading of the first data from the one memory chip of the plurality of memory chips is based on the first physical address in the mapping table.

* * * * *